(12) United States Patent
Wang et al.

(10) Patent No.: US 11,895,926 B2
(45) Date of Patent: Feb. 6, 2024

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Hui-Lin Wang, Taipei (TW); Po-Kai Hsu, Tainan (TW); Ju-Chun Fan, Tainan (TW); Ching-Hua Hsu, Kaohsiung (TW); Yi-Yu Lin, Taichung (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 186 days.

(21) Appl. No.: 17/088,531

(22) Filed: Nov. 3, 2020

(65) Prior Publication Data
US 2022/0115584 A1 Apr. 14, 2022

(30) Foreign Application Priority Data
Oct. 12, 2020 (CN) .......................... 202011083857.6

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/00* (2023.02); *H10N 50/01* (2023.02)

(58) Field of Classification Search
CPC ....... H01L 43/02; H01L 43/12; H01L 27/222; G11C 11/161; H10N 50/80; H10N 50/01; H10B 61/00
USPC .......................................................... 257/421
See application file for complete search history.

(56) References Cited

U.S. PATENT DOCUMENTS

| 2006/0234445 | A1* | 10/2006 | Yang | ...................... | H10N 50/01 438/257 |
| 2015/0171314 | A1* | 6/2015 | Li | .......................... | H01L 43/02 257/421 |
| 2018/0374895 | A1* | 12/2018 | Hsu | ....................... | H01L 23/5226 |
| 2020/0381615 | A1* | 12/2020 | Liu | ........................ | H01L 43/02 |
| 2021/0013401 | A1* | 1/2021 | Lee | ......................... | H01L 43/12 |

OTHER PUBLICATIONS

Liu, the specification, including the claims, and drawings in the U.S. Appl. No. 16/455,674, filed Jun. 27, 2019.

* cited by examiner

*Primary Examiner* — Jami Valentine Miller
(74) *Attorney, Agent, or Firm* — Winston Hsu

(57) ABSTRACT

A method for fabricating a semiconductor device includes the steps of first forming a first inter-metal dielectric (IMD) layer on a substrate and a metal interconnection in the first IMD layer, forming a magnetic tunneling junction (MTJ) and a top electrode on the metal interconnection, forming a spacer adjacent to the MTJ and the top electrode, forming a second IMD layer around the spacer, forming a cap layer on the top electrode, the spacer, and the second IMD layer, and then patterning the cap layer to form a protective cap on the top electrode and the spacer.

9 Claims, 5 Drawing Sheets

MAGNETORESISTIVE RANDOM ACCESS MEMORY AND METHOD FOR FABRICATING THE SAME

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of first forming a first inter-metal dielectric (IMD) layer on a substrate and a metal interconnection in the first IMD layer, forming a magnetic tunneling junction (MTJ) and a top electrode on the metal interconnection, forming a spacer adjacent to the MTJ and the top electrode, forming a second IMD layer around the spacer, forming a cap layer on the top electrode, the spacer, and the second IMD layer, and then patterning the cap layer to form a protective cap on the top electrode and the spacer.

According to another aspect of the present invention, a semiconductor device includes a magnetic tunneling junction (MTJ) on a substrate, a top electrode on the MTJ, and a protective cap on the top electrode.

According to yet another aspect of the present invention, a semiconductor device includes a magnetic tunneling junction (MTJ) on a substrate, a top electrode on the MTJ, a spacer adjacent to the MTJ and the MTJ and the tope electrode, and a protective cap on the top electrode and the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
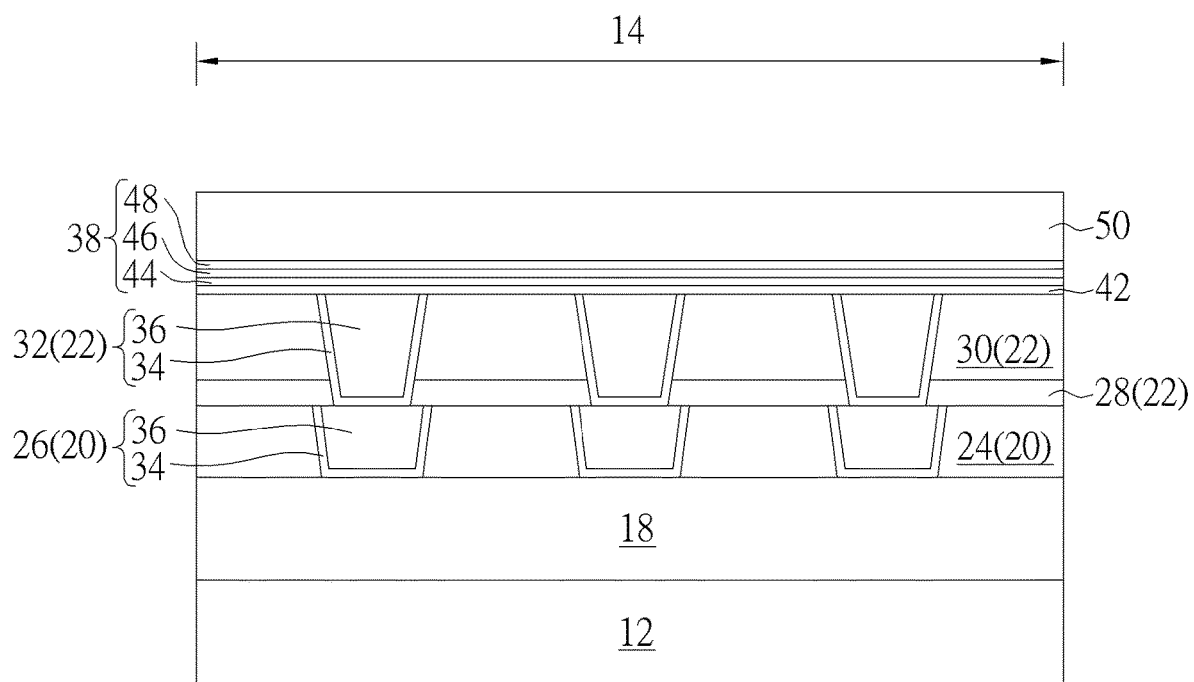
FIGS. 1-6 illustrate a method for fabricating a MRAM device according to an embodiment of the present invention.

Referring to FIGS. 1-6, FIGS. 1-6 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30. In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
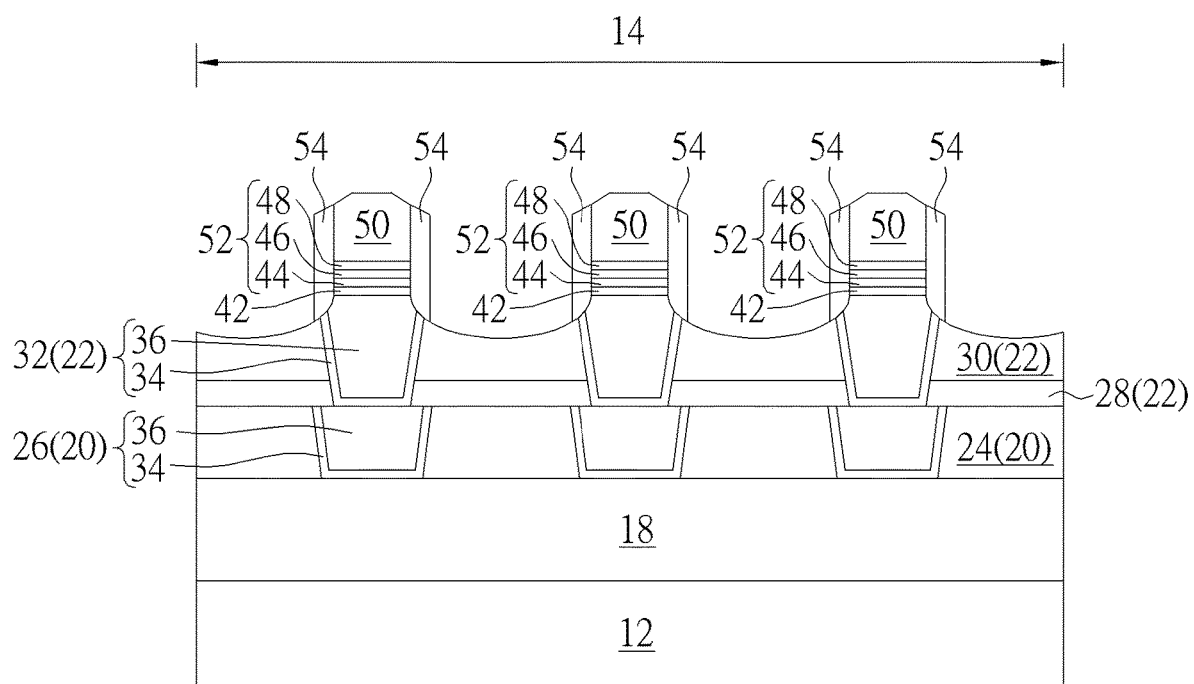

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJ 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer (not shown) is formed on the MTJs 52 while covering the surface of the IMD layer 30, and an etching back process is conducted to remove part of the cap layer for forming a spacer 54 around each of the MTJs 52 or from another perspective forming spacers 54 on sidewalls of the MTJs 52, in which the bottom surface of the spacers 54 is lower than bottom surface of the MTJs 52. In this embodiment, the spacers 54 preferably includes silicon nitride, but could also include other dielectric material including but not limited to for example silicon oxide, silicon oxynitride (SiON), or silicon carbon nitride (SiCN).

Figure 3:
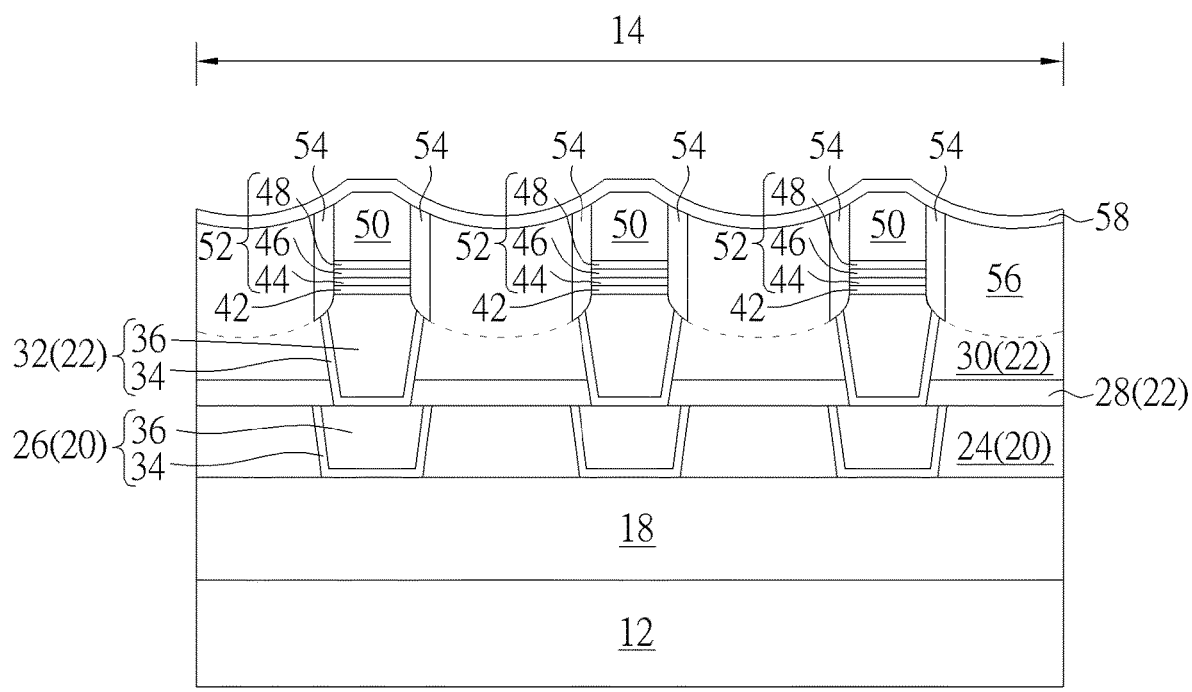

Next, as shown in FIG. 3, an IMD layer 56 is formed on each of the MTJs 52 to surround the spacers 54, and a cap layer 58 is formed on top of the top electrodes 50, the spacers 54, and the IMD layer 56. Preferably, the cap layer 58 is formed conformally on the elements underneath such that the cap layer 58 preferably includes a substantially wavy profile. For instance, the top surface of the cap layer 58 disposed directly on top of the IMD layer 56 is slightly lower than the top surface of the cap layer 58 disposed directly on the top electrodes 50. In this embodiment, the IMD layer 56 preferably include an ultra low-k (ULK) dielectric layer including but not limited to for example porous material or silicon oxycarbide (SiOC) or carbon doped silicon oxide (SiOCH) and the cap layer 58 preferably includes a conductive material or more specifically metal or metal nitride including but not limited to for example tantalum (Ta) or titanium nitride (TiN).

Figure 4:
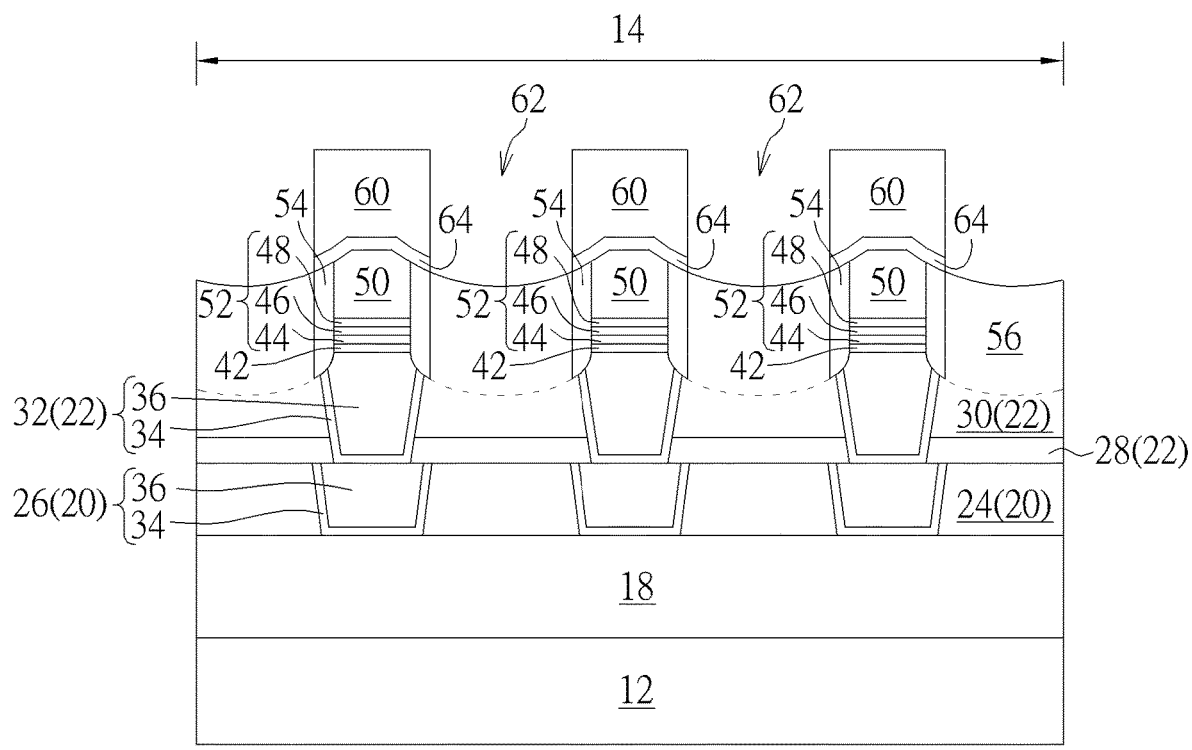

Next, as shown in FIG. 4, a patterned mask 60 such as a patterned resist is formed on the cap layer 58, in which the patterned resist includes a plurality of openings 62 exposing the surface of the cap layer 58. Next, an etching process is conducted by using the patterned mask 60 as mask to remove part of the cap layer 58 for forming a protective cap 64 directly on top of each of the MTJs 52 or top electrodes 50, in which the bottom surface of the protective cap 64 is lower than a top surface of the top electrode 50. It should be noted that even though the sidewalls of each of the protective caps 64 are aligned with outer sidewalls of the spacers 54 underneath, according to other embodiment of the present invention the sidewalls of each of the protective caps 64 could choose not to align with outer sidewalls of the spacers 54 underneath. For instance, each of the protective caps 64 could be disposed to cover the spacer 54 and part of the IMD layer 56 at the same time, which is also within the scope of the present invention.

Figure 5:
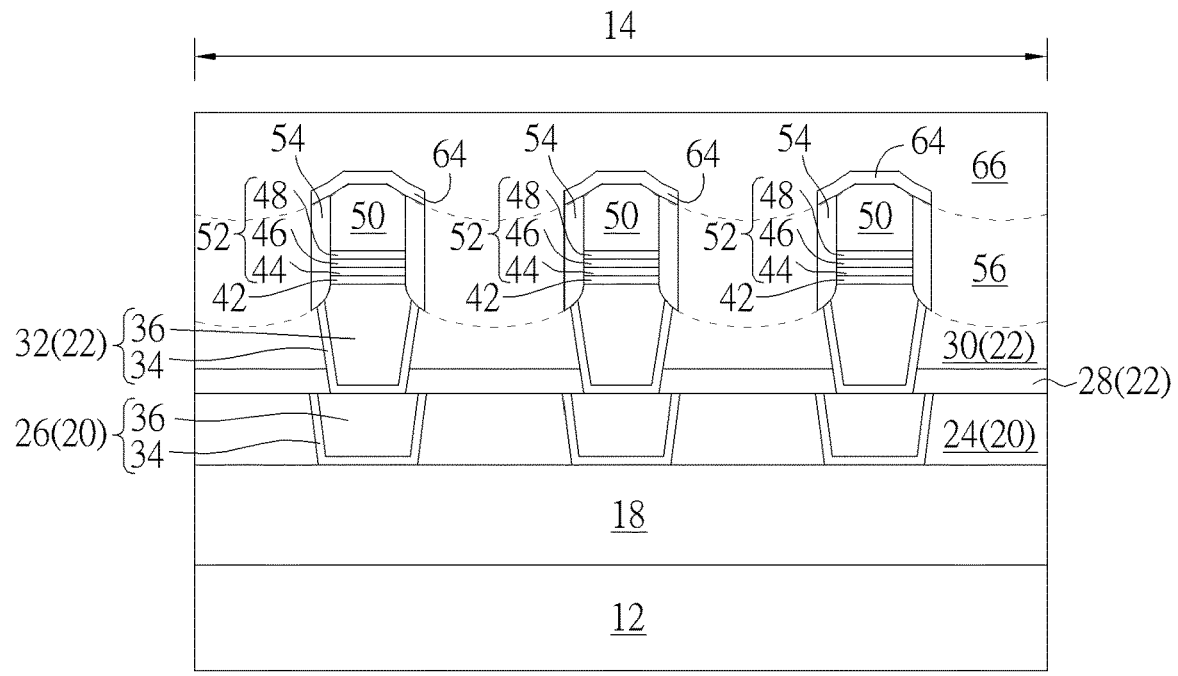

Next, as shown in FIG. 5, after stripping the patterned mask 60, a wet clean process could be conducted to remove remaining impurities on the surface of the protective caps 64, another IMD layer 66 is formed to fully cover the protective caps 64, and a planarizing process such as chemical mechanical polishing (CMP) process is conducted to remove part of the IMD layer 66 so that the top surface of the remaining IMD layer 66 includes a planar surface while the top surface of the IMD layer 66 is still higher than the top surface of the protective caps 64. Similar to the IMD layer 56, the IMD layer 66 preferably include an ultra low-k (ULK) dielectric layer including but not limited to for example porous material or silicon oxycarbide (SiOC) or carbon doped silicon oxide (SiOCH).

Figure 6:
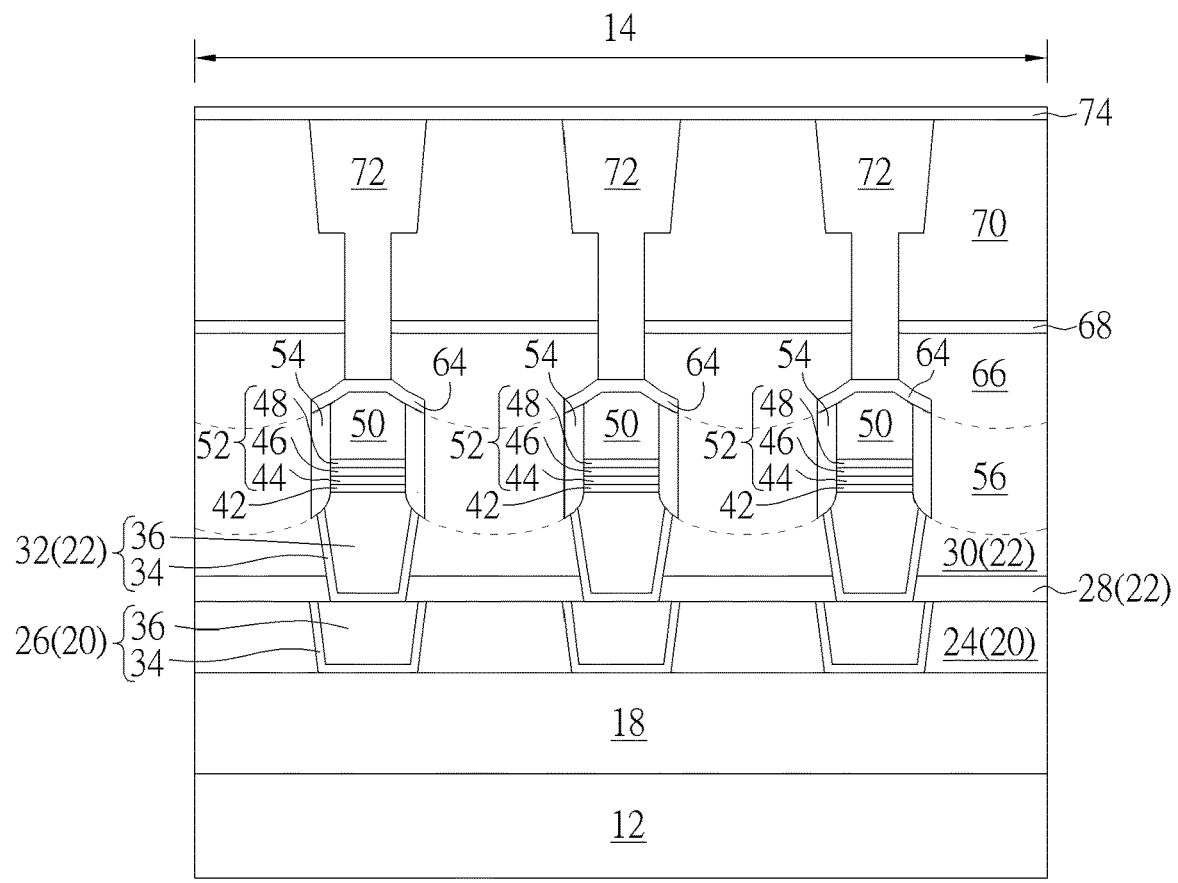

Next, as shown in FIG. 6, a stop layer 68 is formed on the IMD layer 66, an IMD layer 70 is formed on the stop layer 68, and one or more photo-etching process is conducted to remove part of the IMD layer 70, part of the stop layer 68, and part of the IMD layer 66 to form contact holes (not shown) exposing the protective caps 64. Next, conductive materials are deposited into each of the contact holes and a planarizing process such as CMP is conducted to form metal interconnections 72 connecting the MTJs 52 underneath, in which the metal interconnections 72 preferably contacts the protective caps 64 underneath directly. Next, another stop layer 74 is formed on the IMD layer 70 to cover the metal interconnections 72.

In this embodiment, the stop layers 68 and 74 could be made of same or different materials, in which the two layers 68, 74 could all include nitrogen doped carbide (NDC), silicon nitride, silicon carbon nitride (SiCN), or combination thereof. Similar to the metal interconnections formed previously, each of the metal interconnections 72 could be formed in the IMD layer 70 through a single damascene or dual damascene process. For instance, each of the metal interconnections 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 7:
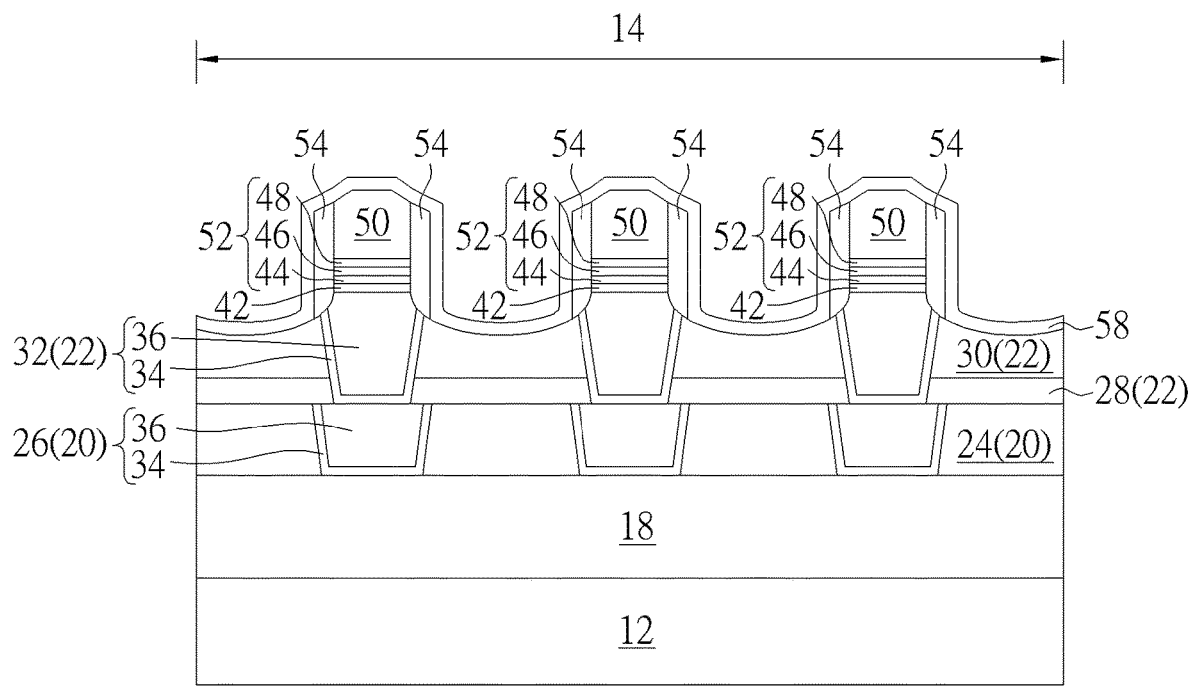
FIGS. 7-10 illustrate a method for fabricating a MRAM device according to an embodiment of the present invention.

Referring to FIGS. 7-10, FIGS. 7-10 illustrate a method for fabricating a MRAM device according to an embodiment of the present invention. For simplicity purpose, elements from the aforementioned embodiments are labeled with same numberings. As shown in FIG. 7, processes conducted through FIGS. 1-2 are carried out to form MTJs 52 on the substrate 12 and spacers 54 on sidewalls of each of the MTJs 52, and then a cap layer 58 is formed directly on the top electrodes 50, spacers 54, and the IMD layer 30. It should be noted that since no additional IMD layer is formed around the spacers 54 before forming the cap layer 58 in this embodiment, the cap layer 58 formed not only covers the top surface of the top electrodes 50 but also contacts the inclined top surface of the spacers 54, sidewalls of the spacers 54, and top surface of the IMD layer 30 directly. Similar to the aforementioned embodiment, the cap layer 58 preferably includes a conductive material or more specifically metal or metal nitride including but not limited to for example tantalum (Ta) or titanium nitride (TiN).

Figure 8:
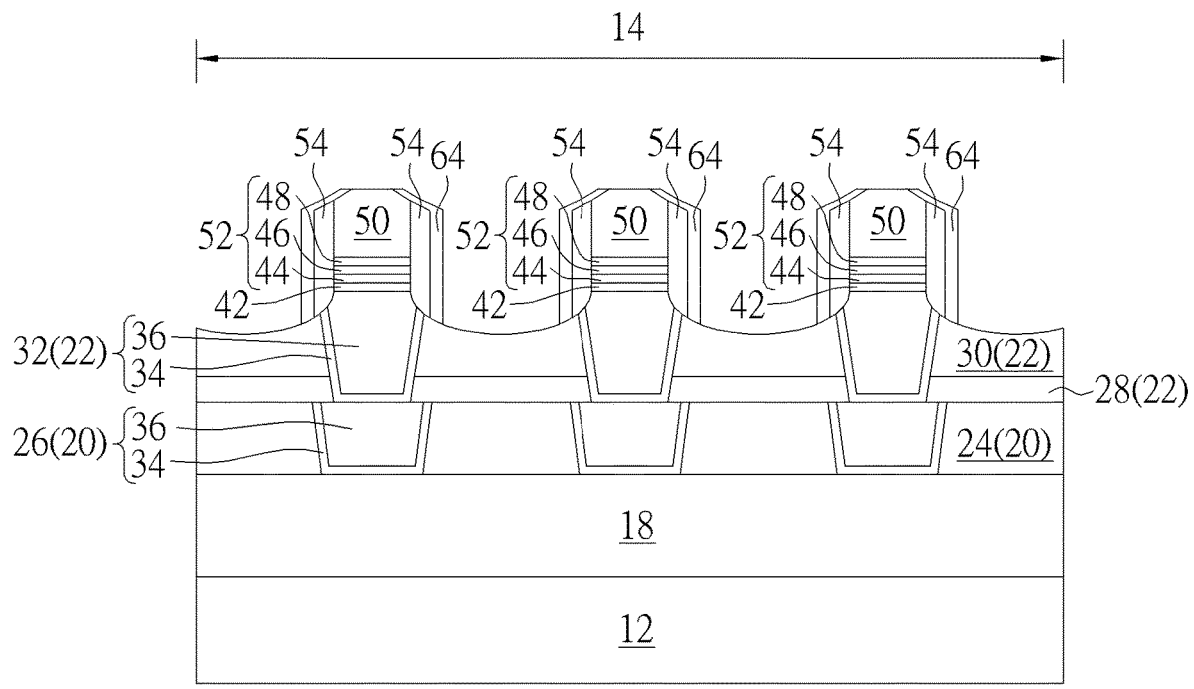

Next, as shown in FIG. 8, an etching back process is conducted to remove part of the cap layer 58 for forming protective caps 64 on the spacers 54 adjacent to two sides of the MTJs 52 or top electrodes 50. In contrast to the protective cap 64 disposed on the top surfaces of the top electrodes 50 and the spacers 54 but not on sidewalls of the spacers 54 as disclosed in the aforementioned embodiment, the protective caps 64 of this embodiment despite not being disposed on the top surface of the top electrodes 50, are disposed on and directly contacting the top surface of the spacers 54, sidewalls of the spacers 54, the top surface of the IMD layer 30, and even the inclined sidewalls of the top electrodes 50 immediately adjacent to two sides of the top surface of the top electrodes 50.

It should be noted that even though the protective caps 64 are not disposed directly on the top surfaces of the top electrodes 50, according to other embodiment of the present invention it would also be desirable to keep part of the cap layer 58 directly on top of the top electrodes 50 so that the protective caps 64 formed afterwards are not only disposed on the top surface of the spacers 54, sidewalls of the spacers 54, top surface of the IMD layer 30, and inclined sidewalls of the top electrodes 50, but also directly contacting the top surface of the top electrodes 50, which is also within the scope of the present invention. According to yet another embodiment of the present invention, it would further be desirable to form the protective caps 64 on the top surface of the spacers 54 and sidewalls of the spacers 54 but not on the top surface of the top electrodes 50 and inclined sidewalls adjacent to two sides of the top surface of the top electrodes 50. In other words, the protective caps 64 are only disposed to directly contact the spacers 54 but not directly contacting any part of the top electrodes 50, which is also within the scope of the present invention.

It should also be noted that since part of the cap layer 58 is covered by the patterned mask 60 during the patterning of the cap layer 58 into protective caps 64, the protective cap 64 formed directly on the top surface of each of the top electrodes 50 and the protective cap 64 disposed on the top surface of the spacers 54 preferably share equal thickness. In this embodiment on the other hand, since the cap layer 58 is directly etched to form into the protective caps 64 without the utilization of patterned mask, the thickness of the protective caps 64 disposed on the inclined sidewalls of the top electrodes 50 and/or top surface of the spacers 54 is slightly less than the thickness of the protective caps 64 disposed on the sidewalls of the spacers 54, as shown in FIG. 8.

Figure 9:
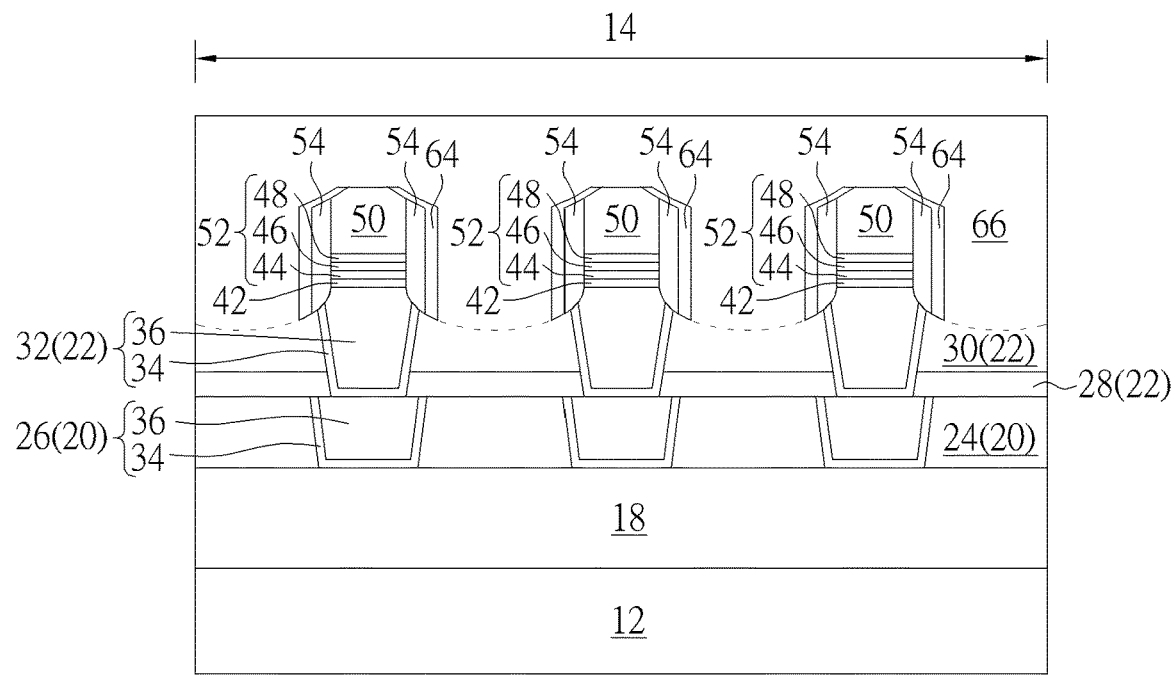

Next, as shown in FIG. 9, another IMD layer 66 is formed to fully cover the protective caps 64, and a planarizing process such as chemical mechanical polishing (CMP) process is conducted to remove part of the IMD layer 66 so that the top surface of the remaining IMD layer 66 includes a planar surface while the top surface of the IMD layer 66 is still higher than the top surface of the protective caps 64. Similar to the IMD layer 56, the IMD layer 66 preferably include an ultra low-k (ULK) dielectric layer including but not limited to for example porous material or silicon oxycarbide (SiOC) or carbon doped silicon oxide (SiOCH).

Figure 10:
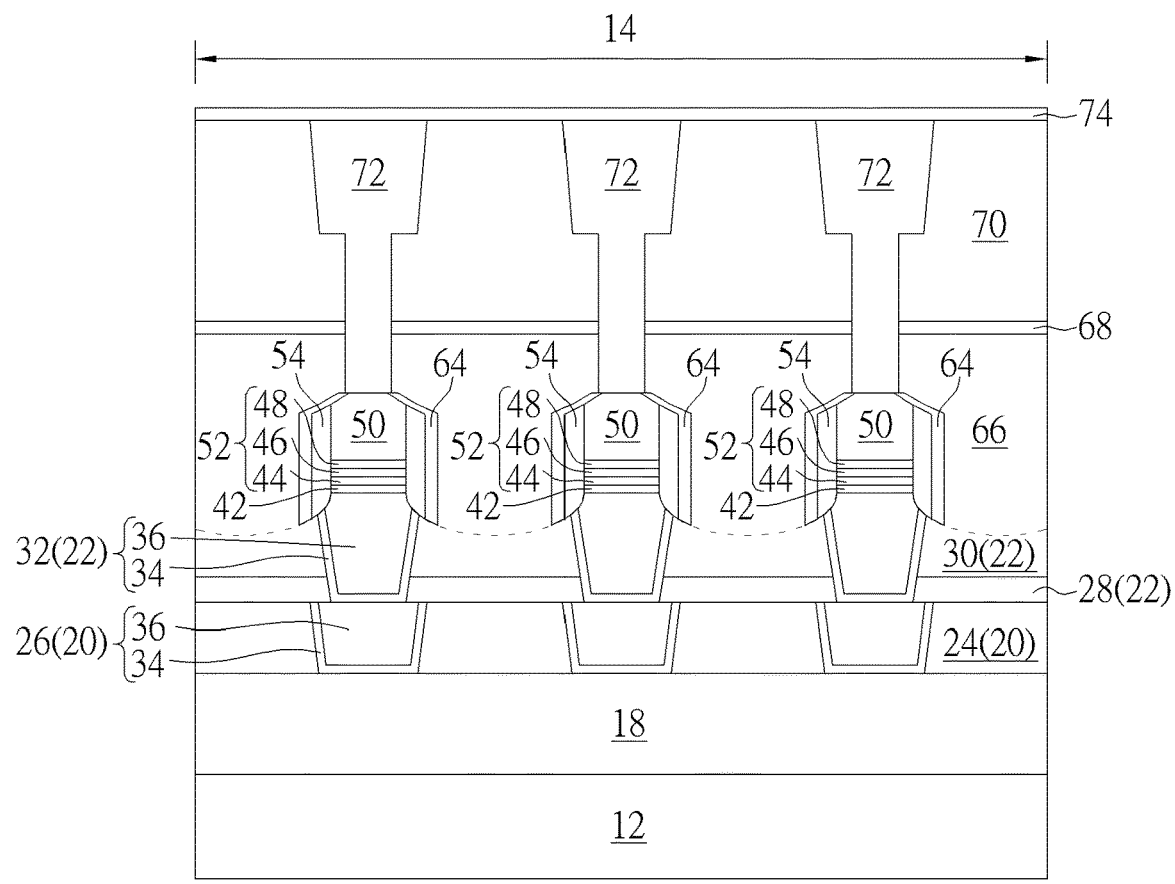

Next, as shown in FIG. 10, a stop layer 68 is formed on the IMD layer 66, an IMD layer 70 is formed on the stop layer 68, and one or more photo-etching process is conducted to remove part of the IMD layer 70, part of the stop layer 68, and part of the IMD layer 66 to form contact holes (not shown) exposing the protective caps 64. Next, conductive materials are deposited into each of the contact holes and a planarizing process such as CMP is conducted to form metal interconnections 72 connecting the MTJs 52 underneath, in which the metal interconnections 72 preferably contact the top electrodes 50 underneath directly. Next, another stop layer 74 is formed on the IMD layer 70 to cover the metal interconnections 72.

Similar to the aforementioned embodiment, the stop layers 68 and 74 could be made of same or different materials, in which the two layers 68, 74 could all include nitrogen doped carbide (NDC), silicon nitride, silicon carbon nitride (SiCN), or combination thereof. Similar to the metal interconnections formed previously, each of the metal interconnections 72 could be formed in the IMD layer 70 through a single damascene or dual damascene process. For instance, each of the metal interconnections 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, the present invention first forms spacers on sidewalls of the MTJ and then forms a protective cap preferably made of conductive material such as metal or metal nitride on the MTJ or top electrode atop the MTJ, in which the protective cap could be disposed only on the top surface of the top electrode and top surface of the spacer as shown in FIG. 6 or could be disposed on the top surface of the spacer and sidewalls of the spacer but not on the top surface of the top electrode as shown in FIG. 10. By using the aforementioned approach to form protective caps on the MTJ and the spacer, it would be desirable to prevent over-etching of the spacers and damage to the MTJs during formation of metal interconnections through dual damascene process conducted afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a magnetic tunneling junction (MTJ) on a substrate;
   a top electrode on the MTJ;
   a protective cap on and directly contacting all of a top surface of the top electrode, wherein the protective cap is made of conductive material; and
   a metal interconnection on and directly contacting the protective cap.

2. The semiconductor device of claim 1, further comprising:
   a spacer adjacent to the MTJ and the top electrode, wherein the protective cap is on the top electrode and the spacer.

3. The semiconductor device of claim 2, further comprising:
   a first inter-metal dielectric (IMD) layer around the spacer;
   a stop layer on the first IMD layer;
   a second IMD layer on the stop layer; and
   the metal interconnection in the second IMD layer, the stop layer, and the first IMD layer and connected to the top electrode.

4. The semiconductor device of claim 2, wherein a sidewall of the protective cap is aligned with a sidewall of the spacer.

5. The semiconductor device of claim 1, wherein a bottom surface of the protective cap is lower than a top surface of the top electrode.

6. A semiconductor device, comprising:
   a magnetic tunneling junction (MTJ) on a substrate;
   a top electrode on the MTJ;
   a spacer adjacent to the MTJ and the MTJ and the top electrode; and
   a protective cap on the top electrode and the spacer, wherein the protective cap directly contacts a sidewall of the spacer and a bottom surface of the protective cap is aligned with a bottom surface of the spacer.

7. The semiconductor device of claim 6, further comprising:
   a first inter-metal dielectric (IMD) layer around the spacer;
   a stop layer on the first IMD layer;
   a second IMD layer on the stop layer; and
   a metal interconnection in the second IMD layer, the stop layer, and the first IMD layer and connected to the top electrode.

8. The semiconductor device of claim 6, wherein a bottom surface of the spacer is lower than a bottom surface of the MTJ.

9. The semiconductor device of claim 6, wherein the protective cap comprises metal.

* * * * *